United States Patent
Sakamoto et al.

(10) Patent No.: US 10,847,379 B2
(45) Date of Patent: Nov. 24, 2020

(54) ETCHING METHOD AND ETCHING APPARATUS

(71) Applicant: TOKYO ELECTRON LIMITED, Tokyo (JP)

(72) Inventors: Masato Sakamoto, Nirasaki (JP); Tadahiro Ishizaka, Nirasaki (JP); Takeshi Itatani, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/407,674

(22) Filed: May 9, 2019

(65) Prior Publication Data

US 2019/0348299 A1    Nov. 14, 2019

(30) Foreign Application Priority Data

May 11, 2018  (JP) ................... 2018-092321

(51) Int. Cl.
  *H01L 21/3213* (2006.01)
  *H01L 21/311* (2006.01)
  *H01L 21/3065* (2006.01)
  *H01J 37/32* (2006.01)

(52) U.S. Cl.
  CPC .... *H01L 21/32136* (2013.01); *H01J 37/3244* (2013.01); *H01L 21/3065* (2013.01); *H01L 21/31111* (2013.01)

(58) Field of Classification Search
  CPC ......... H01L 21/32136; H01L 21/31111; H01L 21/3065; H01L 21/768; H01L 21/02063; H01L 21/31122; H01L 21/76814; H01L 21/67069; H01J 37/3244; H01J 37/32715
  See application file for complete search history.

(56) References Cited

U.S. PATENT DOCUMENTS

| | | | |
|---|---|---|---|
| 2004/0137733 A1* | 7/2004 | Hautala ................ | C23F 4/00 438/689 |
| 2015/0206774 A1* | 7/2015 | Singh ................. | H01L 21/3065 156/345.35 |

FOREIGN PATENT DOCUMENTS

| | | |
|---|---|---|
| JP | 2017535057 A | 11/2017 |
| KR | 1020160121436 A | 10/2016 |

* cited by examiner

*Primary Examiner* — Nadine G Norton
*Assistant Examiner* — Mahmoud Dahimene
(74) *Attorney, Agent, or Firm* — Nath, Goldberg & Meyer; Jerald L. Meyer

(57) ABSTRACT

An etching method includes: adsorbing an adsorbate based on a processing gas containing $BCl_3$ gas onto a target object, which serves as a to-be-etched object, by: supplying $H_2$ gas and the processing gas to a process space in which the target object is disposed; and applying power of a predetermined frequency to the process space, while supplying the $H_2$ gas is stopped, to generate plasma in the process space; and etching the target object by generating plasma of a rare gas in the process space to activate the adsorbate.

9 Claims, 5 Drawing Sheets

|  | H2 flow | BCl3+H2 feeding | BCl3+H2 plasma | BCl3 plasma | Ar plasma |
|---|---|---|---|---|---|
| (1) Reference | × | × | × | O | O |
| (2) BCl3+H2 gas only | × | O | × | O | O |
| (3) BCl3+H2 plasma | × | O | O | O | O |
| (4) H2 flow→BCl3 plasma | O | × | × | O | O |
| (5) No Ar plasma | × | O | × | O | × |
| (6) No BCl3 plasma | × | O | × | × | O |

ETCHING METHOD AND ETCHING APPARATUS

CROSS-REFERENCE TO RELATED APPLICATION

This application is based upon and claims the benefit of priority from Japanese Patent Application No. 2018-092321, filed on May 11, 2018, the entire contents of which are incorporated herein by reference.

TECHNICAL FIELD

The present disclosure relates to an etching method and an etching apparatus.

BACKGROUND

As a kind of etching technique, an atomic layer etching (ALE) method of etching an etching target film in an atomic layer unit is known.

SUMMARY

The present disclosure provides a technique capable of increasing the etching selection ratio between different oxide films.

According to one embodiment of the present disclosure, an etching method includes: adsorbing an adsorbate based on a processing gas containing $BCl_3$ gas onto a target object, which serves as a to-be-etched object, wherein the step of adsorbing the adsorbate comprises: supplying $H_2$ gas and the processing gas to a process space in which the target object is disposed; and applying power of a predetermined frequency to the process space, while supplying the $H_2$ gas is stopped, to generate plasma in the process space; and etching the target object by generating plasma of a rare gas in the process space to activate the adsorbate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of an etching method and an etching apparatus disclosed in the present application will be described in detail with reference to the drawings. The etching method and etching apparatus disclosed herein are not limited by the embodiments.

In the atomic layer etching, an etching target film is etched by repeating the adsorption step of causing an adsorbate based on a processing gas to be adsorbed to the etching target film by plasma of the processing gas and the etching step of activating the adsorbate by rare gas plasma. In the manufacture of semiconductors, the use of atomic layer etching using $BCl_3$ gas as a processing gas has been studied. For example, in the manufacture of semiconductors, via holes and trenches formed in a silicon oxide film formed by, for example, $SiO_2$, are buried to form a wiring layer connected to a metal layer at the bottom of a via hole or a trench. A metal oxide film is formed over the metal layer at the bottom of the via hole or the trench by natural oxidation, and the wiring resistance of the wiring layer is increased. Therefore, the removal of the metal oxide film at the bottom of the via hole or the trench by atomic layer etching using $BCl_3$ gas before forming the wiring layer has been studied.

However, in the atomic layer etching using $BCl_3$ gas, the difference in etching rate between the metal oxide film and the silicon oxide film is small, and thus it is impossible to obtain a sufficient selection ratio. Therefore, it is expected to increase the etching selection ratio between different oxide films.

[Configuration of Etching Apparatus]

Figure 1:
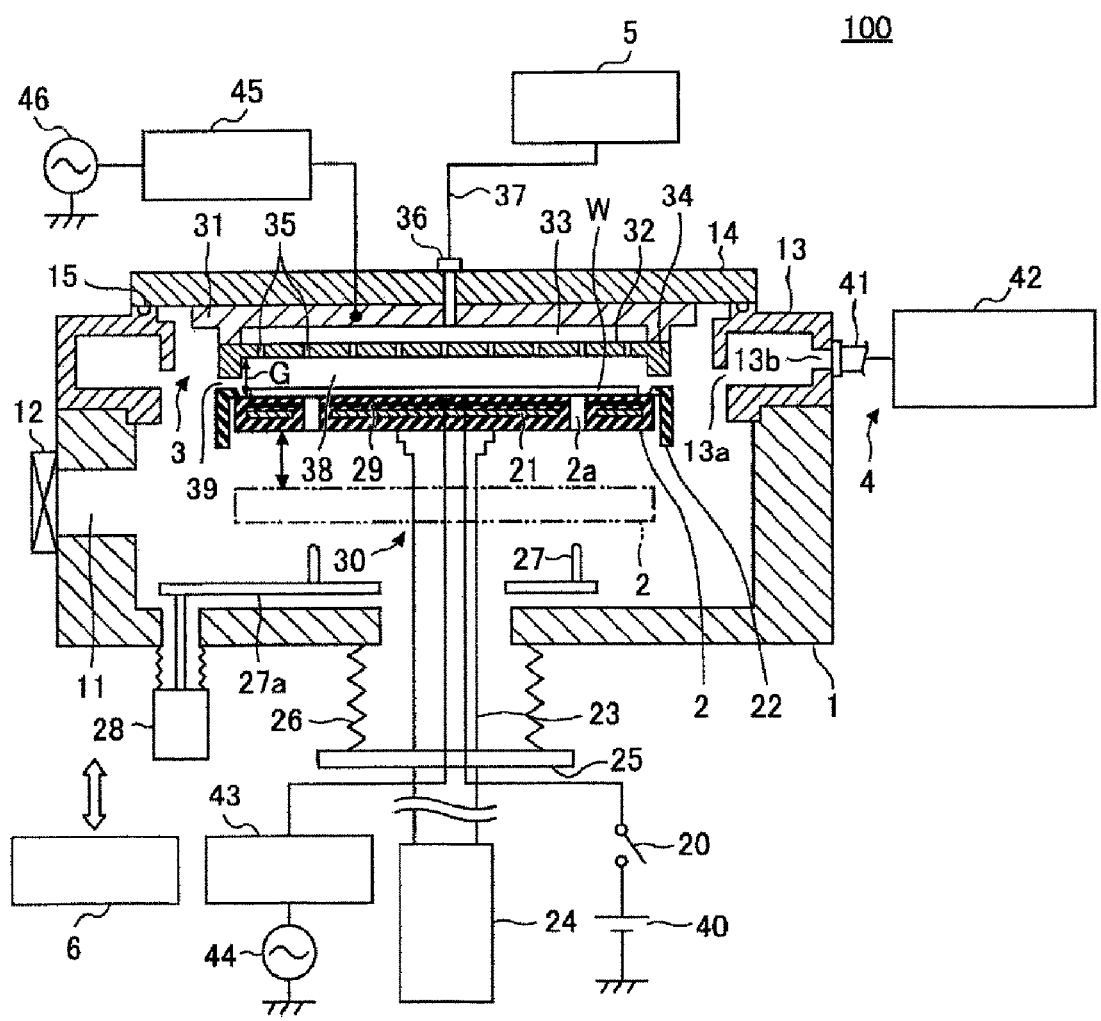
FIG. 1 is a cross-sectional view illustrating an example of a schematic configuration of an etching apparatus according to an embodiment.

Next, the configuration of an etching apparatus according to an embodiment will be described. In the following description, a case where a to-be-etched target object is a semiconductor wafer (hereinafter referred to as a "wafer") and atomic layer etching is performed on the semiconductor wafer by an etching apparatus will be described by way of an example. FIG. 1 is a cross-sectional view illustrating an example of a schematic configuration of an etching apparatus according to an embodiment. The etching apparatus 100 has a process container 1, a mounting table 2, a shower head 3, an exhaust part 4, a gas supply mechanism 5, and a controller 6. In the embodiment, the shower head 3 corresponds to a supply part.

The process container 1 is made of a metal such as aluminum and has a substantially cylindrical shape.

A loading/unloading port 11 is formed in the side wall of the process container 1 so as to load or unload a wafer W. The loading/unloading port 11 is opened or closed by a gate valve 12. An annular exhaust duct 13 having a rectangular cross section is provided on the main body of the process container 1. A slit 13a is formed in the exhaust duct 13 along the inner peripheral surface. An exhaust port 13b is formed in the outer wall of the exhaust duct 13. On the upper surface of the exhaust duct 13, a ceiling wall 14 is provided so as to close the upper opening of the process container 1. A space between the exhaust duct 13 and the ceiling wall 14 is hermetically sealed with a seal ring 15.

The mounting table 2 horizontally supports the wafer W in the process container 1. The mounting table 2 is formed in a disk shape having a size corresponding to the wafer W, and is supported by the support member 23. The mounting table 2 is formed of a ceramic material such as aluminum nitride (AlN) or a metal material such as aluminum or nickel alloy, and a heater 21 and an electrode 29 are embedded in the mounting table 2 to heat the wafer W. The heater 21 is supplied with power from a heater power supply (not illustrated) and generates heat. Then, the output of the heater 21 is controlled by a temperature signal of a thermocouple (not illustrated) provided in the vicinity of the upper surface of the mounting table 2, whereby the wafer W is controlled to a predetermined temperature.

A first high-frequency power supply (lower part) 44 is connected to the electrode 29 via a matching device 43. The matching device 43 matches a load impedance to the internal impedance of the first high-frequency power supply 44. The first high-frequency power supply 44 applies power of a predetermined frequency to the mounting table 2 via the electrode 29. For example, the first high-frequency power supply 44 applies high-frequency power of 13.56 MHz to the mounting table 2 via the electrode 29. The high-frequency power is not limited to 13.56 MHz, and, for example, 450 KHz, 2 MHz, 27 MHz, 60 MHz, or 100 MHz may be appropriately used. In this way, the mounting table 2 also functions as a lower electrode.

The electrode 29 is connected to an adsorption power supply 40 via an ON/OFF switch 20 disposed outside the process container 1, and also functions as an electrode for adsorbing the wafer W onto the mounting table 2.

A second high-frequency power supply (upper part) 46 is connected to the shower head 3 via a matching device 45. The matching device 45 matches a load impedance to the internal impedance of the second high-frequency power supply 46. The second high-frequency power supply 46 applies power of a predetermined frequency to the shower head 3. For example, the second high-frequency power supply 46 applies high-frequency power of 13.56 MHz to the shower head 3. The high-frequency power is not limited to 13.56 MHz, and, for example, 450 KHz, 2 MHz, 27 MHz, 60 MHz, 100 MHz, or the like may be appropriately used. In this way, the shower head 3 also functions as an upper electrode.

The mounting table 2 is provided with a cover member 22 made of ceramics such as alumina so as to cover the outer peripheral region and the side surface of the upper surface. An adjustment mechanism 30 configured to adjust a gap G between the upper electrode and the lower electrode is provided on the bottom surface of the mounting table 2. The adjustment mechanism 30 includes a support member 23 and a lifting mechanism 24. The support member 23 supports the mounting table 2 from the center of the bottom surface of the mounting table 2. In addition, the support member 23 penetrates a hole formed in the bottom wall of the process container 1 and extends to the lower side of the process container 1, and the lower end thereof is connected to the lifting mechanism 24. The mounting table 2 ascends and descends through the support member 23 by the lifting mechanism 24. The adjustment mechanism 30 raises and lowers the lifting mechanism 24 between a processing position, which is indicated by a solid line in FIG. 1, and a transport position, which is indicated by the two-dot chain line below the processing position and at which the wafer W is capable of being transported, so that the wafer W can be loaded or unloaded.

A flange part 25 is provided on the support member 23 below the process container 1, and a bellows 26, which partitions the atmosphere in the process container 1 from the outside air, is provided between the bottom surface of the process container 1 and the flange part 25 to expand and contract in response to the ascending/descending movement of the mounting table 2.

Three wafer support pins 27 (only two are illustrated) are provided in the vicinity of the bottom surface of the process container 1 so as to protrude upward from a lifting plate 27a. The wafer support pins 27 ascends and descends via the lifting plate 27a by a lifting mechanism 28 provided below the process container 1.

The wafer support pins 27 are inserted through a through holes 2a formed in the mounting table 2 located at the transport position and are configured to protrude and retract with respect to the upper surface of the mounting table 2. By causing the wafer support pins 27 to ascend or descend in this manner, the wafer W is delivered between a wafer transport mechanism (not illustrated) and the mounting table 2.

The shower head 3 supplies a processing gas into the process container 1 in a shower form. The shower head 3 is made of metal and is provided to face the mounting table 2. The shower head 3 has a diameter, which is substantially the same as that of the mounting table 2. The shower head 3 includes a main body part 31 fixed to the ceiling wall 14 of the process container 1 and a shower plate 32 connected to the lower side of the main body part 31. A gas diffusion space 33 is formed between the main body part 31 and the shower plate 32. In the gas diffusion space 33, a gas introduction hole 36 is provided through the center of the main body part 31 and the ceiling wall 14 of the process container 1. An annular protrusion 34 protruding downward is formed on the peripheral edge portion of the shower plate 32. Gas ejection holes 35 are formed in the flat surface inside the annular protrusion 34. In the state in which the mounting table 2 is in the processing position, a process space 38 is formed between the mounting table 2 and the shower plate 32, and the upper surface of the cover member 22 and the annular protrusion 34 are close to each other so as to form an annular gap 39.

The exhaust part 4 exhausts the inside of the process container 1. The exhaust part 4 includes an exhaust pipe 41 connected to the exhaust port 13b, and an exhaust mechanism 42 connected to the exhaust pipe 41 and including, for example, a vacuum pump and a pressure control valve. During the processing, the gas in the process container 1 reaches the exhaust duct 13 via the slit 13a, and is exhausted from the exhaust duct 13 through the exhaust pipe 41 by the exhaust mechanism 42.

A gas supply mechanism (supply parts) 5 is connected to the gas introduction hole 36 of the shower head 3 via a gas supply line 37. The gas supply mechanism 5 is connected to gas supply sources of various gases used for etching via gas supply lines, respectively. For example, the gas supply mechanism 5 is connected to a gas supply source that supplies various gases such as $BCl_3$ gas, $H_2$ gas, and a rare gas via the gas supply lines. Each gas supply line branches properly to correspond to an etching process, and is provided with an opening/closing valve and a flow rate controller. The gas supply mechanism 5 is configured to control the flow rates of various gases by controlling the opening/closing valve and the flow rate controller provided in each gas supply line. During the etching, the gas supply mechanism 5 supplies each of the various gases used for etching into the process container 1 via the gas supply line 37 and the shower head 3.

In the etching apparatus 100 configured as described above, the operation is generally controlled by the controller 6. The controller 6 is, for example, a computer, and includes, for example, a central processing unit (CPU), a random access memory (RAM), a read only memory (ROM), and an auxiliary storage device. The CPU operates on the basis of a program stored in the ROM or the auxiliary storage device or a process condition of atomic layer etching so as to control the operations of the entire apparatus. For example, the controller 6 controls the operation of supplying various gases from the gas supply mechanism 5, the ascending/descending operation of the lifting mechanism 24, the exhaust operation of the inside of the process container 1 by the exhaust mechanism 42, and supply power from the first high-frequency power supply 44 and the second high-frequency power supply 46. In addition, the computer-readable program necessary for control may be stored in a storage medium. The storage medium includes, for example, a flexible disk, a compact disc (CD), a CD-ROM, a hard disk, a flash memory, or a DVD. Further, the controller 6 may be provided inside or outside the etching apparatus 100. In the case where the controller 6 is provided outside the etching apparatus 100, the controller 6 is capable of controlling the plasma etching apparatus 10 through a wired or wireless communication mechanism.

Figure 2:
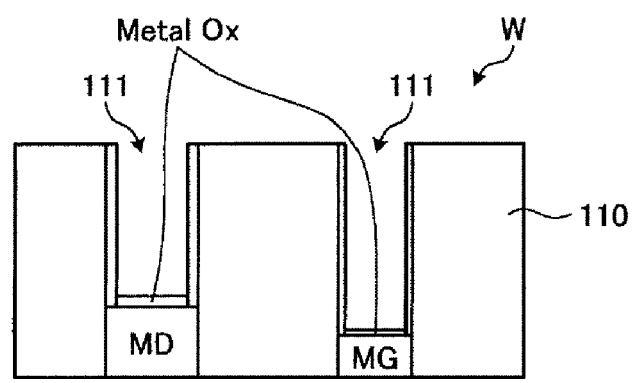
FIG. 2 is a view illustrating an example of a semiconductor-manufacturing step.

Next, the flow of etching executed by the etching apparatus 100 under the control of the controller 6 will be described. In the etching apparatus 100, the exhaust mechanism 42 is operated to decompress the inside of the process container 1 to a vacuum atmosphere. In the etching apparatus 100, when the wafer W is loaded, the lifting mechanism 24 is operated to cause the mounting table 2 to descend to the transport position, and the gate valve 12 is opened. A wafer W is carried into the mounting table 2 by a wafer transport mechanism such as a robot arm (not illustrated) via the loading/unloading port 11. Different oxide films are formed over the wafer W. For example, as illustrated in FIG. 2, via holes 111 are formed in a silicon oxide film 110 on the wafer W, and metal layers such as a metal gate MG and a trench contact MD are provided in the lower portions of the via holes 111. On these metal layers, a metal oxide film is formed by, for example, natural oxidation. In the etching apparatus 100, the gate valve 12 is closed, and the lifting mechanism 24 is operated to raise the mounting table 2 to the processing position.

The etching apparatus 100 performs atomic layer etching of the wafer W in the embodiment illustrated in FIG. 5, which will be described below. For example, in the etching apparatus 100, the gas supply mechanism 5 is controlled to supply $H_2$ gas and a processing gas containing $BCl_3$ gas from the shower head 3 to the process space 38 between the mounting table 2 and the shower plate 32. Then, in the etching apparatus 100, the gas supply mechanism 5 is controlled to stop the supply of the $H_2$ gas, the first high-frequency power supply 44 and/or the second high-frequency power supply 46 is controlled to supply the process space 38 with power of a predetermined frequency so as to generate plasma in the process space 38, and an adsorption step of causing an adsorbate based on the processing gas to be adsorbed on the wafer W is performed. Further, in the etching apparatus 100, the gas supply mechanism 5 to is controlled to supply Ar gas from the shower head 3 to the process space 38, the first high-frequency power supply 44 and/or the second high-frequency power supply 46 is controlled to apply high-frequency power to the pressing space so as to generate plasma in the process space 38, the adsorbate adsorbed on the wafer W is activated, whereby the etching step of etching the wafer W is performed.

Therefore, the etching apparatus 100 is able to remove a metal oxide film on the metal layers such as the metal gate MG and the trench contact MD while suppressing damage to the silicon oxide film 110 illustrated in FIG. 2.

FIG. 2 is a view illustrating an example of a semiconductor-manufacturing step. On the wafer W, a silicon oxide film 110 made of, for example, $SiO_2$, is formed. In the silicon oxide film 110, via holes 111 are formed. A metal layer such as a metal gate MG or a trench contact MD is provided in the lower portions of the via holes 111. Examples of the material of the metal layer include Al (aluminum), Co (cobalt), W (tungsten), TiN (titanium nitride), TiSiN, TiAlC, and TaN. A metal oxide film is formed over the bottom metal layers in the via holes 111 by, for example, natural oxidation.

Therefore, the removal of the metal oxide film at the bottom of the via hole 111 or the trench by atomic layer etching using $BCl_3$ gas has been studied.

Figure 3:
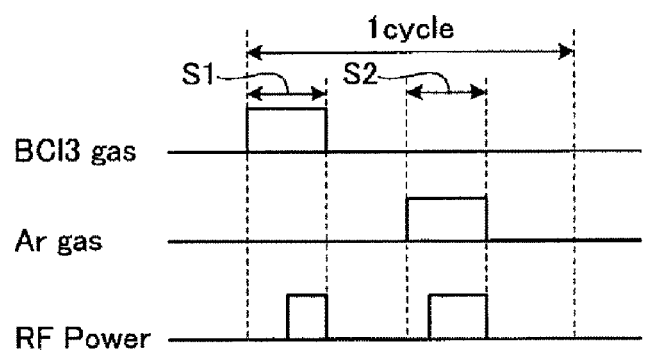
FIG. 3 is a view illustrating an example of a flow of atomic layer etching of a comparative example.

Here, a flow of atomic layer etching using $BCl_3$ gas will be described. FIG. 3 is a view illustrating an example of a flow of atomic layer etching of a comparative example. FIGS. 4A to 4D are views schematically illustrating an example of a flow of etching by atomic layer etching. In FIGS. 4A to 4D, a flow of etching $Al_2O_3$ (alumina) as a metal oxide film by atomic layer etching is illustrated.

For example, in the atomic layer etching of a comparative example illustrated in FIG. 3, an adsorption step S1 and an etching step S2 are performed in order, and are repeated a desired number of times.

Figure 4A:
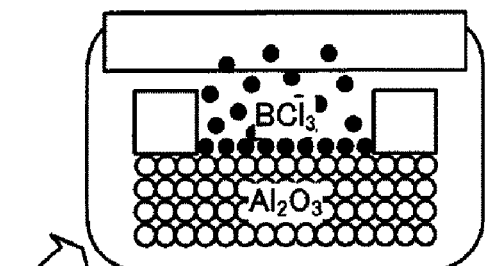
FIGS. 4A to 4D are views schematically illustrating an example of a flow of etching by atomic layer etching.
Figure 4B:
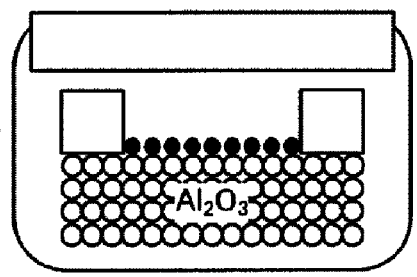

In the adsorption step S1, $BCl_3$ gas is supplied (FIG. 4A), and high-frequency power (RF Power) is applied to generate plasma. As a result, as illustrated in FIG. 4B, an adsorbate based on $BCl_3$ gas is adsorbed to the surface of $Al_2O_3$. This adsorbate is, for example, AlCl, $BO_x$.

Figure 4D:
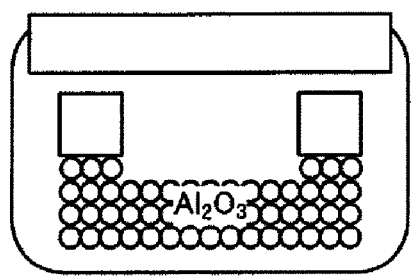
Figure 4C:
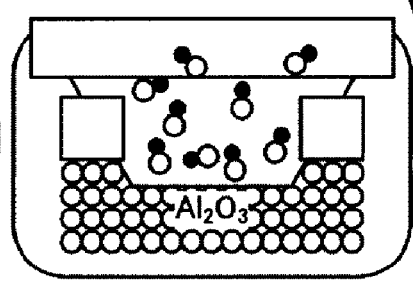

In the etching step S2, a rare gas such as Ar gas is supplied, and high-frequency power (RF Power) is applied to generate plasma. As a result, as illustrated in FIGS. 4C and 4D, the adsorbate is activated by Ar gas, and the surface of $Al_2O_3$ is etched. In atomic layer etching, the adsorption step S1 and the etching step S2 are set as one cycle, and a plurality of cycles are repeated until a required etching amount is obtained. In the atomic layer etching, purge processes such as purge gas supply and exhaust are performed at necessary timing, such as between the adsorption step S1 and the etching step S2. For example, in the atomic layer etching, the adsorption step S1 and the etching step S2 are repeated one or more times with the purge step performed therebetween.

However, in the atomic layer etching of the comparative example illustrated in FIG. 3, the difference in etching rate between the metal oxide film and the silicon oxide film 110 is small. Therefore, the silicon oxide film 110 may be excessively etched, and thus the pattern formed in the silicon oxide film 110 may be damaged in some cases. In other words, the selection ratio becomes very small, and portions, which are not originally etched, are also etched to be out of shape.

Thus, the present applicant has found a technique that is capable of increasing the etching selection ratio between different oxide films by supplying $H_2$ gas and a processing gas containing $BCl_3$ gas, and applying high-frequency power while stopping the supply of $H_2$ gas so as to generate plasma. In this embodiment, a case where only $BCl_3$ gas is supplied as a processing gas and Ar gas is supplied as a rare gas used for activating an adsorbate will be described by way of an example. The processing gas is not limited to a single gas of $BCl_3$ gas, but may include, for example, a chloride such as $Cl_2$. In addition, the rare gas used for activating the adsorbate is not limited to Ar gas, but may be other rare gases such as $N_2$ or a mixed rare gas.

Figure 5:
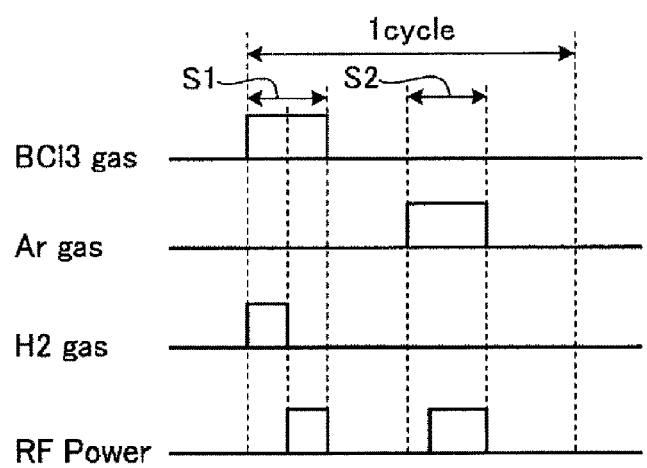
FIG. 5 is a view illustrating an example of a flow of atomic layer etching according to an embodiment.

FIG. 5 is a view illustrating an example of a flow of atomic layer etching according to an embodiment. Even in the atomic layer etching of a comparative example illustrated in FIG. 3, an adsorption step S1 and an etching step S2 are performed in order, and are repeated a desired number of times.

In the adsorption step S1, $BCl_3$ gas and $H_2$ gas are supplied, and high-frequency power (RF Power) is applied while stopping the supply of $H_2$ gas so as to generate plasma. Here, the gas flow rate ratio of $H_2$ gas to $BCl_3$ gas is preferably 1:1.5 to 1:4. In addition, it is preferable that the supply of the $H_2$ gas is stopped immediately before the application of the high-frequency power, but the present disclosure is not limited thereto. The supply of the $H_2$ gas may be stopped within a period of several seconds (e.g., 1 second) of the timing at which the application of the high-frequency power starts from several seconds (e.g., 3 seconds) before the application of the high-frequency power. For example, in the adsorption step S1, $H_2$ gas is supplied only for a stabilization time that stabilizes the gas flow rate to a flow rate suitable for plasma excitation, and the supply of $H_2$ gas is stopped after plasma excitation.

In the etching step S2, a purge gas is supplied to purge and exhaust $BCl_3$ gas, then Ar gas is supplied as illustrated in FIG. 5, and high-frequency power (RF Power) is applied to generate plasma. Therefore, the adsorbate is activated by Ar gas, and the surface of $Al_2O_3$ is etched. In the atomic layer etching of the embodiment, the adsorption step S1 and the etching step S2 are also set as one cycle, and a plurality of cycles are also repeated until a required etching amount is obtained.

Next, the etching results of the atomic layer etching of the comparative example and the atomic layer etching of the embodiment are compared.

Figure 6A:
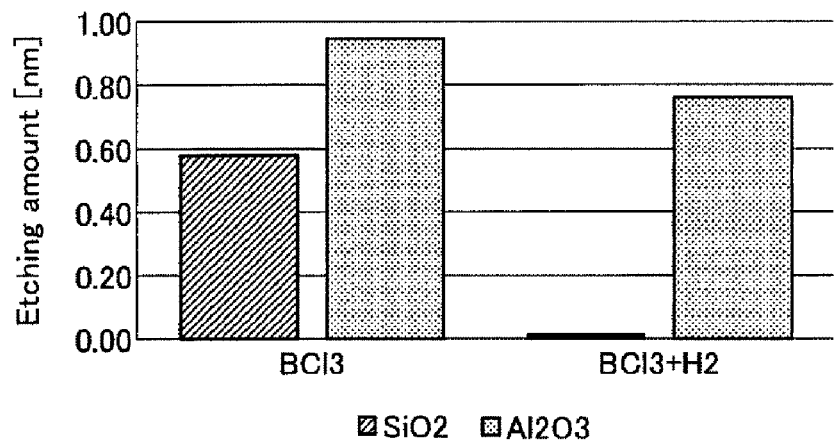
FIG. 6A is a view illustrating an example of a result of comparing etching amounts.

The atomic layer etching of the comparative example was carried out under the following conditions.
Adsorption Step
Pressure: 15 to 500 mTorr
Flow rate of $BCl_3$ gas: 10 to 200 sccm
Input high-frequency power: 20 to 200 W
Process time: 10 to 120 sec
Etching Step
Pressure: 15 to 500 mTorr
Flow rate of Ar gas: 10 to 500 sccm
Input high-frequency power: 10 to 200 W
Process time: 5 to 120 sec Meanwhile, the atomic layer etching of the embodiment was carried out under the following conditions.
Adsorption Step
Pressure: 15 to 500 mTorr
Flow rate of $BCl_3$ gas: 10 to 200 sccm
Flow rate of $H_2$ gas: 10 to 200 sccm
Input high-frequency power: 20 to 200 W
Process time: 10 to 120 sec
Etching Step
Pressure: 15 to 500 mTorr
Flow rate of Ar gas: 10 to 500 sccm
Input high-frequency power: 10 to 200 W
Process time: 5 to 120 sec FIG. 6A is a view illustrating an example of a result of comparing etching amounts. On the left side of FIG. 6A, the etching amounts of $SiO_2$ and $Al_2O_3$ by atomic layer etching of the comparative example using $BCl_3$ gas at the time of adsorption are represented. In addition, on the right side of FIG. 6A, the etching amounts of $SiO_2$ and $Al_2O_3$ by atomic layer etching according to the embodiment using $BCl_3$ gas and $H_2$ gas at the time of adsorption are represented.

As illustrated on the left side of FIG. 6A, in the atomic layer etching of the comparative example, the etching amount of $SiO_2$ is 0.57 nm and the etching amount of $Al_2O_3$ is 0.94 nm. From this result, when the selection ratio was obtained by the etching amount of $Al_2O_3$/etching amount of $SiO_2$, the selection ratio of $SiO_2$ and $Al_2O_3$ was 1.65.

Meanwhile, as illustrated on the right side of FIG. 6A, in the atomic layer etching of the embodiment, the etching amount of $SiO_2$ was reduced to 0.01 nm or smaller, and the selection ratio of $SiO_2$ and $Al_2O_3$ was 143. The mechanism by which the etching amount of $SiO_2$ decreases is presumed as follows. On the $SiO_2$, it is assumed that an H—Cl film is formed over the surface by introduction of the $BCl_3$ gas and the $H_2$ gas, and etching is not carried out since the H—Cl film has the effect of the protective film. In addition, on the $Al_2O_3$, it is assumed that etching is carried out since it becomes Al—Cl higher in energy than H—Cl from the viewpoint of bonding energy.

As described above, in the atomic layer etching of the embodiment, it is possible to increase the etching selection ratio between different oxide films such as $SiO_2$ and $Al_2O_3$. For example, in the atomic layer etching of the embodiment, the selection ratio between the silicon oxide film formed over a to-be-processed object and the metal oxide film formed over the metal layer may be set to 5 or larger.

Figure 6B:
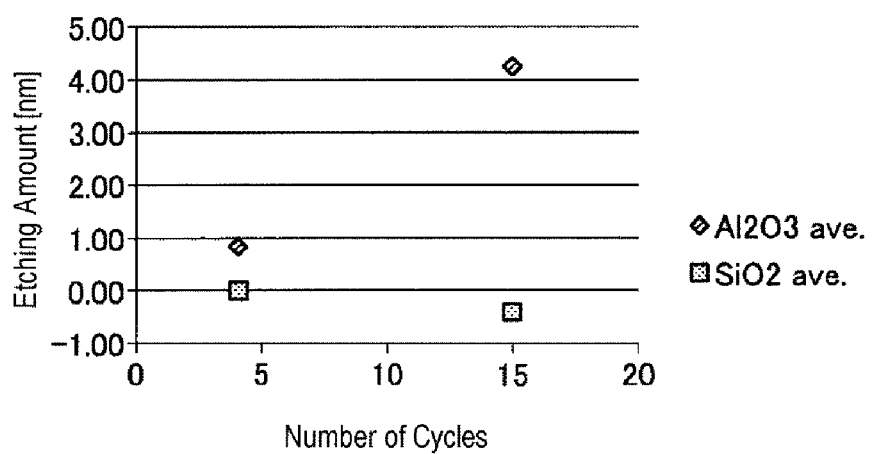
FIG. 6B is a view illustrating an example of a result obtained by carrying out multiple cycles of atomic layer etching of an embodiment.

FIG. 6B is a view illustrating an example of a result obtained by carrying out multiple cycles of atomic layer etching of an embodiment. FIG. 6B represents the average value of the etching amounts of $SiO_2$ and $Al_2O_3$ in the case in which the atomic layer etching was performed for 4 cycles and the case in which the atomic layer etching was performed for 15 cycles. As illustrated in FIG. 6B, the etching amount of $Al_2O_3$ is increased depending on the number of cycles. Meanwhile, the etching amount of $SiO_2$ hardly increases even if the number of cycles increases. In FIG. 6B, the etching amount of $SiO_2$ at 15 cycles becomes negative. The reason for this is presumed to be a measurement error since reactants have deposited on the $SiO_2$ film.

Figures 7A, 7B:
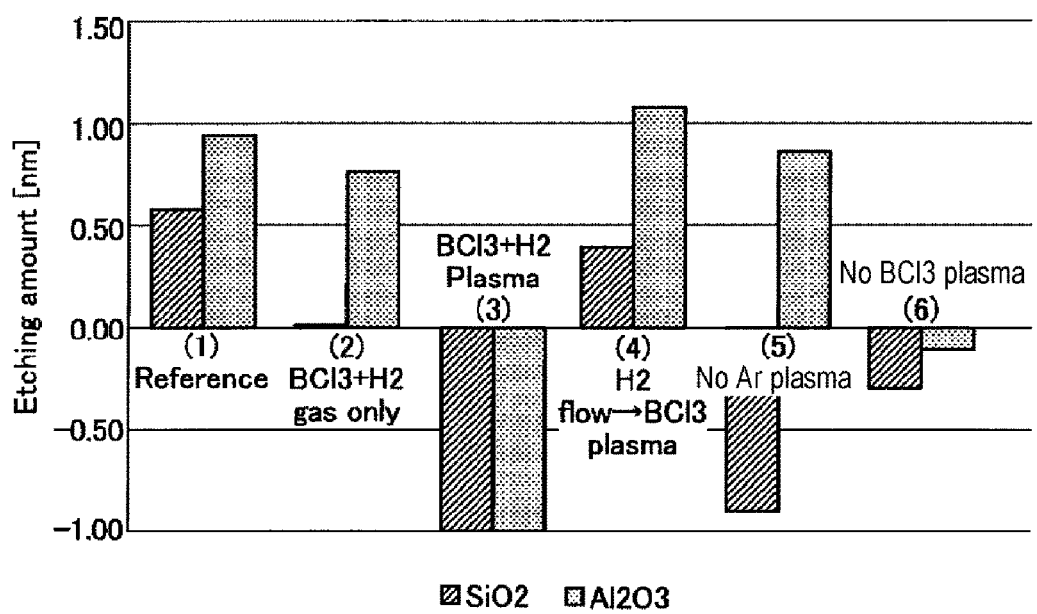
FIG. 7A is a view illustrating comparative atomic layer-etching processes.
FIG. 7B is a view illustrating an example of a result of comparing etching amounts of atomic layer etching.

Next, a part of the process of atomic layer etching is changed to compare the etching amounts. FIG. 7A is a view illustrating comparative atomic layer-etching processes. In Comparative Example (1) in FIG. 7A, plasma was generated by applying high-frequency power while supplying $BCl_3$ gas, and then plasma was generated by supplying Ar gas and applying high-frequency power. This corresponds to the plasma atomic layer etching of the comparative example illustrated in FIG. 3. Comparative Example (1) serves as a reference for comparison. In Comparative Example (2), plasma was generated by supplying $BCl_3$ gas and $H_2$ gas and applying high-frequency power while stopping the supply of $H_2$ gas, and plasma was generated by supplying Ar gas and applying high-frequency power. This corresponds to the atomic layer etching of the embodiment illustrated in FIG. 5. In Comparative Example (3), plasma was generated by applying high-frequency power while supplying $H_2$ gas and a processing gas containing $BCl_3$ gas, and then plasma was generated by supplying Ar gas and applying high-frequency power. That is, in Comparative Example (3), in the atomic layer-etching adsorption step S1 of the embodiment shown in FIG. 5, $H_2$ gas was supplied while plasma was being generated by applying high-frequency power (RF Power). In Comparative Example (4), plasma was generated by supplying $H_2$ gas, supplying $BCl_3$ gas while stopping the supply of $H_2$ gas was stopped, and applying high-frequency power, and then plasma was generated by supplying Ar gas and applying high-frequency power. That is, in Comparative Example (4), in the atomic layer-etching adsorption step S1 of the embodiment illustrated in FIG. 5, the $BCl_3$ gas was not supplied, but $H_2$ gas is supplied before generating the plasma, and the supply of $H_2$ gas was stopped and $BCl_3$ gas was supplied when plasma is generated. In Comparative Example (5), plasma was generated by supplying $BCl_3$ gas and $H_2$ gas and applying high-frequency power while stopping the supply of $H_2$ gas, and then plasma generation was not performed by supplying Ar gas. That is, in Comparative Example (5), the etching step S2 for atomic layer etching of the embodiment illustrated in FIG. 5 was not performed. In Comparative Example (6), plasma was generated by supplying $BCl_3$ gas and $H_2$ gas, then supplying Ar gas, and applying high-frequency power. That is, in Comparative Example (6), in the atomic layer-etching adsorption step S1 of the embodiment illustrated in FIG. 5, no high-frequency power was applied and no plasma was generated.

FIG. 7B is a view illustrating an example of a result of comparing etching amounts of atomic layer etching. In Comparative Examples (1) to (6) of FIG. 7B, the etching amounts of $SiO_2$ and $Al_2O_3$ by atomic layer etching of Comparative Examples (1) to (6) illustrated in FIG. 7A are represented. Comparative Example (1) is the etching amount by atomic layer etching of the comparative example illustrated in FIG. 3. Since the difference between the etching amounts of $SiO_2$ and $Al_2O_3$ is small, the selection ratio between $SiO_2$ and $Al_2O_3$ is also small Comparative Example (2) is the etching amount by atomic layer etching of the embodiment illustrated in FIG. 5. Since the difference between the etching amounts of $SiO_2$ and $Al_2O_3$ is large, the selection ratio between $SiO_2$ and $Al_2O_3$ is also large. In Comparative Example (3), the etching amounts of $SiO_2$ and $Al_2O_3$ become negative, and the films of $SiO_2$ and $Al_2O_3$ are deposited. Therefore, when the supply of the $H_2$ gas is continued while the plasma of the adsorption step S1 is being generated, the film is deposited. Comparing Comparative Example (4) with Comparative Example (1), since a small difference between the etching amounts of $SiO_2$ and $Al_2O_3$ is small and the selection ratio between $SiO_2$ and $Al_2O_3$ is also small, it cannot be said to be a sufficient selection ratio in Comparative Example (4). In Comparative Example (5), although $Al_2O_3$ is etched, the etching amount of $SiO_2$ becomes negative, and a $SiO_2$ film is deposited. In Comparative Example (6), the etching amounts of $SiO_2$ and $Al_2O_3$ become negative, and $SiO_2$ and $Al_2O_3$ films are deposited.

From Comparative Example (1) in FIG. 7B, when $BCl_3$ gas was supplied but $H_2$ gas was not supplied before plasma was generated, the selection ratio between $SiO_2$ and $Al_2O_3$ is small. From Comparative Example (4) in FIG. 7B, when $H_2$ gas was supplied but $BCl_3$ gas was not supplied before plasma was generated, the selection ratio between $SiO_2$ and $Al_2O_3$ is also small. Therefore, it is necessary to supply $BCl_3$ gas and $H_2$ gas before plasma is generated.

In addition, from Comparative Example (5) of FIG. 7B, when the plasma of Ar gas is not generated and the etching step S2 is not performed, a $SiO_2$ film is deposited. In addition, from Comparative Example (6) of FIG. 7B, when no plasma is generated in the adsorption step S1, $SiO_2$ and $Al_2O_3$ films are deposited. Therefore, it is necessary to generate plasma in each of the adsorption step S1 and the etching step S2.

In addition, from Comparative Example (2) of FIG. 7B, when plasma is generated by supplying $BCl_3$ gas and $H_2$ gas, and applying high-frequency power while stopping the supply of $H_2$ gas, the selection ratio between $SiO_2$ and $Al_2O_3$ is large. However, from Comparative Example (3) in FIG. 7B, when the supply of the $H_2$ gas is continued until the plasma of the adsorption step S1 is generated, $SiO_2$ and $Al_2O_3$ films are deposited. Therefore, the timing of stopping the supply of $H_2$ gas is preferably before the application of the high-frequency power, more preferably immediately before the application of the high-frequency power. However, the timing of stopping the supply of the $H_2$ gas is not limited thereto. Even if some $H_2$ gas is supplied at the initial stage of plasma generation, the influence on etching is small. The timing of stopping the supply of the $H_2$ gas may be within a period of several seconds (e.g., 1 second) of the timing at which the application of the high-frequency power starts from several seconds (e.g., 3 seconds) before the application of the high-frequency power.

As described above, the etching method according to this embodiment includes the adsorption step S1 and the etching step S2. In the adsorption step S1, $H_2$ gas and a processing gas containing $BCl_3$ gas are supplied to the process space 38 in which the wafer W is placed as a to-be-etched object, and power of a predetermined frequency is applied to the process space 38 while stopping the supply of $H_2$ gas to generate plasma in the process space 38, whereby the adsorbate based on the processing gas is adsorbed on the to-be-processed object. In the etching step S2, rare gas plasma is generated in the process space 38 to activate the adsorbate, and the wafer W is etched. Thus, in the etching method according to this embodiment, it is possible to increase the etching selection ratio between different oxide films.

In the etching method according to this embodiment, in the adsorption step S1, the supply of $H_2$ gas is stopped until high-frequency power is applied to the process space 38. Thus, with the etching method according to this embodiment, it is possible to suppress the deposition of a film when plasma is generated, and to obtain the high etching selection ratio between different oxide films.

In the etching method according to this embodiment, in the adsorption step S1, $H_2$ gas is supplied only for the stabilization time for plasma excitation. Thus, in the etching method according to this embodiment, it is possible to supply $H_2$ gas at appropriate timing, and thus it is possible to further increase the etching selection ratio between different oxide films.

In the wafer W according to this embodiment, via holes 111 reaching a metal layer are formed in the silicon oxide film 110, and a natural oxide film is formed over the metal layer. Thus, in the etching method according to this embodiment, it is possible to suppress damage to a pattern of the via holes 111 or the like formed in the silicon oxide film 110 and to remove a natural oxide film formed in the metal layer.

In addition, the etching apparatus 100 according to this embodiment includes a process container 1, a shower head 3 serving as a supply part, a first high-frequency power supply 44 and a second high-frequency power supply 46 serving as a power supply part, and a controller 6. In the process container 1, as a to-be-etched object, a wafer W is disposed over the mounting table 2, and the process space 38 is formed over the mounting table 2. The shower head 3 supplies $H_2$ gas, a rare gas, and a processing gas containing $BCl_3$ gas to the process space 38. The first high-frequency power supply 44 and the second high-frequency power supply 46 apply electric power of a predetermined frequency to the process space 38. When etching the wafer W, the controller 6 performs control to carry out: an adsorption step S1 of causing an adsorbate based on a processing gas to be adsorbed onto a wafer W by supplying $H_2$ gas and a processing gas containing $BCl_3$ gas from the shower head 3 to the process space 38, and applying power of a predetermined frequency to the process space 38 from the first high-frequency power supply 44 and the second high-frequency power supply 46 while stopping the supply of the $H_2$ gas from the shower head 3 to generate plasma in the process space 38; and an etching step S2 of generating rare gas plasma from the shower head 3 in the process space 38 to activate the adsorbate and to etch the wafer W. Thus, in the etching apparatus 100, it is possible to increase the etching selection ratio between different oxide films.

Although the embodiments have been described above, it should be considered that the embodiments disclosed herein are examples in all respects and is not restrictive. Indeed, it is possible to implement the embodiments described above in various forms. In addition, the embodiments described above may be omitted, replaced, or modified in various forms without departing from the scope and spirit of the appended claims.

For example, in the embodiments, a case where a to-be-etched object is a semiconductor wafer has been described by way of an example, but the present disclosure is not limited thereto. The to-be-processed object may be another substrate such as a glass substrate.

According to the present disclosure, it is possible to increase the etching selection ratio between different oxide films.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method comprising:
    adsorbing an adsorbate based on a processing gas containing $BCl_3$ gas onto a target object, which serves as a to-be-etched object, wherein the step of adsorbing the adsorbate comprises:
        supplying $H_2$ gas and the processing gas to a process space in which the target object is disposed; and
        applying power of a predetermined frequency to the process space, while supplying the $H_2$ gas is stopped and the processing gas continues to be supplied to the process space, to generate plasma of the processing gas in the process space; and
    etching the target object by generating plasma of a rare gas in the process space to activate the adsorbate.

2. The etching method of claim 1, wherein the step of adsorbing the adsorbate further comprises stopping supplying the $H_2$ gas before the power of the predetermined frequency is applied to the process space.

3. The etching method of claim 1, wherein the step of adsorbing the adsorbate further comprises supplying the $H_2$ gas only for a stabilization time for plasma excitation.

4. The etching method of claim 1, wherein the target object is a semiconductor wafer including, in a silicon oxide film:
    a via hole formed to reach a metal layer; and
    a natural oxide film formed over the metal layer.

5. The etching method of claim 1, wherein the step of adsorbing the adsorbate and the step of etching the target object are repeated one or more times, and purging is performed between the step of adsorbing the adsorbate and the step of etching the target object.

6. The etching method of claim 1, wherein a gas flow rate ratio of $BCl_3$ and $H_2$ supplied for a stabilization time during the step of adsorbing the adsorbate ranges from 1.15 to 1.4.

7. The etching method of claim 1, wherein a selection ratio between a silicon oxide film formed over the target object and a metal oxide film formed over a metal layer is 5 or larger.

8. The etching method of claim 1, wherein the rare gas supplied during the step of etching the target object is Ar.

9. The etching method of claim 1, wherein the power applied during the step of adsorbing the adsorbate and the step of etching the target object is applied from at least one selected from the group of an upper part and a lower part.

* * * * *